United States Patent
Philippens et al.

(10) Patent No.: US 8,829,496 B2
(45) Date of Patent: Sep. 9, 2014

(54) ORGANIC COMPONENT AND METHOD FOR THE PRODUCTION THEREOF

(75) Inventors: Marc Philippens, Regensburg (DE); Tilman Schlenker, Nittendorf (DE)

(73) Assignee: OSRAM Opto Semiconductors GmbH, Regensburg (DE)

(*) Notice: Subject to any disclaimer, the term of this patent is extended or adjusted under 35 U.S.C. 154(b) by 41 days.

(21) Appl. No.: 13/387,978

(22) PCT Filed: Jul. 8, 2010

(86) PCT No.: PCT/EP2010/059837
§ 371 (c)(1),
(2), (4) Date: May 15, 2012

(87) PCT Pub. No.: WO2011/012420
PCT Pub. Date: Feb. 3, 2011

(65) Prior Publication Data
US 2012/0256170 A1   Oct. 11, 2012

(30) Foreign Application Priority Data

Jul. 30, 2009  (DE) .......................... 10 2009 035 392

(51) Int. Cl.
*H01L 51/00* (2006.01)

(52) U.S. Cl.
USPC ...................... 257/40; 257/680; 257/E51.022

(58) Field of Classification Search
USPC ............ 257/40, 431–433, 678, 686, E51.022, 257/680
See application file for complete search history.

(56) References Cited

U.S. PATENT DOCUMENTS

| | | | |
|---|---|---|---|
| 6,736,942 B2 | 5/2004 | Weihs et al. | |
| 6,998,776 B2 | 2/2006 | Aitken et al. | |
| 7,202,553 B2* | 4/2007 | Snyder et al. | 257/678 |
| 7,871,949 B2 | 1/2011 | Lee et al. | |
| 2001/0046597 A1 | 11/2001 | Weihs et al. | |
| 2002/0182436 A1 | 12/2002 | Weihs et al. | |
| 2003/0066311 A1 | 4/2003 | Li et al. | |
| 2004/0251524 A1 | 12/2004 | Snyder et al. | |
| 2007/0170855 A1* | 7/2007 | Choi et al. | 313/512 |
| 2007/0171637 A1* | 7/2007 | Choi | 362/227 |

FOREIGN PATENT DOCUMENTS

| | | |
|---|---|---|
| DE | 10 2004 049 955 | 4/2006 |
| DE | 10 2005 044 523 | 3/2007 |
| EP | 1 359 628 | 11/2003 |
| EP | 1 897 861 | 8/2007 |
| KR | 10-0787463 | 12/2007 |

* cited by examiner

Primary Examiner — Brook Kebede
(74) Attorney, Agent, or Firm — Cozen O'Connor

(57) ABSTRACT

A device comprising: a first substrate (1); a second substrate; at least one optoelectronic component (4) containing at least one organic material is arranged on the first substrate; the first substrate (1) and the second substrate (2) being arranged relative to one another in such a way that the optoelectronic component (4) is arranged between the first substrate (1) and the second substrate; a bonding material (3) is arranged between the first substrate (1) and the second substrate (2), said bonding material enclosing the optoelectronic component (4) in a frame type fashion and mechanically connecting the first and second substrates (1, 2) to one another; and wherein the bonding material (3) was softened by an exothermic chemical process of a reactive material (7) for mechanically connecting the substrates (1, 2).

12 Claims, 3 Drawing Sheets

ORGANIC COMPONENT AND METHOD FOR THE PRODUCTION THEREOF

RELATED APPLICATIONS

This is a U.S. national stage of application No. PCT/EP2010/059837, filed on Jul. 8, 2010.

This application claims the priority of German application no. 10 2009 035 392.5 filed Jul. 30, 2009, the entire content of which is hereby incorporated by reference.

FIELD OF INVENTION

The present invention relates to a device comprising a first substrate and a second substrate. Furthermore, the invention relates to a method for producing such a device.

BACKGROUND OF THE INVENTION

A device comprising two substrates and an organic light emitting diode (OLED) arranged therebetween is known for example from the patent specification U.S. Pat. No. 6,998,776 B2. In this case, two substrates are connected to one another by means of a seal. The seal is formed by means of a frit that has been heated by means of a laser source such that the frit is melted and thus forms an airtight seal.

In methods of this type, the heating of the frit is usually effected locally by means of a circulating laser beam. In this case, the laser beam has to pass through one of the two substrates in order to be able to reach the frit. A substrate material that is not transparent to the laser beam is therefore unsuitable in production methods of this type. In regions, too, in which metallic conductor tracks are arranged on one of the substrates, it is not possible for the laser beam to reach the frit. The heating of the frit by means of a circulating laser beam is furthermore too slow and therefore substantially unsuitable for mass production. Furthermore, a high outlay in respect of apparatus disadvantageously arises as a result of the laser beam being guided along the frit.

SUMMARY OF THE INVENTION

One object of the invention is to provide an improved device which protects an organic optoelectronic component against ambient influences and at the same time has simplified production. A further object is to provide an alternative method for producing such a device.

In one embodiment of the device, a first substrate and a second substrate are provided, wherein at least one optoelectronic component containing at least one organic material is arranged on the first substrate.

Preferably, the first substrate and the second substrate are arranged relative to one another in such a way that the optoelectronic component is arranged between the first substrate and the second substrate.

In a further embodiment, a bonding material is arranged between the first substrate and the second substrate, said bonding material enclosing the optoelectronic component in a frame-type fashion and mechanically connecting the first and second substrates to one another.

In one preferred development, the bonding material was softened by means of an exothermic chemical process of a reactive material for the purpose of mechanically connecting the substrates.

In one particularly preferred embodiment, the device comprising a first substrate and a second substrate, wherein at least one optoelectronic component is arranged on the first substrate. Furthermore, the first substrate and the second substrate are arranged relative to one another in such a way that the optoelectronic component is arranged between the first substrate and the second substrate. A bonding material is arranged between the first substrate and the second substrate, said bonding material enclosing the optoelectronic component in a frame-type fashion and mechanically connecting the first and second substrates to one another. The bonding material was softened by means of an exothermic chemical process of a reactive material for the purpose of mechanically connecting the substrates.

The optoelectronic component is preferably completely enclosed by the first substrate, the second substrate and the bonding material. In this case, the two substrates and the bonding material preferably form a closed cell in which the optoelectronic component is arranged. In this case, the cell is composed of two base areas, in particular the first substrate and the second substrate, and side areas, in particular the bonding material, wherein the side areas connect the two base areas to one another.

As a result of the process of softening by means of a reactive material, in particular the bonding material of the finished device can have residues of the reactive material in regions. In this case, residues of the reactive material are understood to mean not only portions of the reactive material itself, but also reaction products that can arise during the exothermic process.

Consequently, the previously softened and preferably subsequently hardened bonding material can comprise in regions additional constituents, in particular residues, of the reactive material and/or of its reaction products.

The protection of the organic optoelectronic component against ambient influences is accordingly effected by the bonding material, which was softened between the first and second substrates such that the bonding material constitutes a mechanical connection between the first substrate and the second substrate.

Ambient influences should be understood to mean, in particular, the penetration of air and/or moisture into the device. The penetration of air or moisture into the device would lead to damage or even to destruction of the optoelectronic organic component. The lifetime of the device can advantageously be significantly increased by an airtight closure of the device.

The airtight seal is preferably effected by means of a reactive material. For this purpose, the bonding material was temporarily softened by means of an exothermic chemical process of the reactive material and subsequently hardened by means of cooling.

In order to start the exothermic chemical process of the reactive material, an initial ignition, for example a spark or a laser beam, is preferably used. After the initial ignition, the reactive material reacts exothermically, preferably without evolution of gas, and emits large amounts of energy in this case, whereby the reactive material heats up. As a result of heat transfer, the bonding material softens temporarily at least in the surrounding of the reactive material. That is to say that the energy released by the reactive material is sufficient to soften or melt the bonding material.

Consequently, suitable reactive materials include all materials or material mixtures which, after an initial ignition, undergo an exothermic chemical reaction, preferably without evolution of gas and preferably automatically. Suitable materials and material mixtures are described for example in the US patent US 2001/0046597 A1, the disclosure content of which is hereby incorporated by reference.

Preferably, the reactive material comprises an element and an oxide or a compound. In this case, the reactive material preferably reacts via the element that converts the oxide or the compound by means of a reduction, such that a stabler oxide or a stabler compound preferably arises.

By way of example, Al, Si, Ti, Zr or Hf can be used as the element. For this purpose, by way of example, $Fe_2O_3$, CuO, ZnO or NiB is possible as the oxide or compound. In this case, a metal (Fe, Cu Zn or Ni) and a further oxide or a further compound ($Al_2O_3$, $SiO_2$, $TiO_2$, $ZrO_2$, $HfO_2$, $TiB_2$, $ZrB_2$ or $HfB_2$) arise as possible end products after the exothermic chemical process.

In this case, regions of the device which have no reactive material experience no or hardly any heating. As a result, the risk of damage to the organic optoelectronic component which stems from excessively high temperatures in the device can advantageously be minimized.

In one preferred embodiment, the reactive material is introduced into the bonding material.

By virtue of reactive material introduced into the bonding material, the reactive material in the bonding material can react after an initial ignition. By virtue of the fact that the reactive material reacts exothermically, the reactive material preferably heats up and thereby causes the surrounding bonding material to melt. By virtue of the fact that the reactive material is introduced into the bonding material, uniform softening of the bonding material can preferably be ensured, whereby a uniform airtight seal is advantageously effected.

Furthermore, the exothermic chemical process of the reactive material propagates very rapidly over the entire bonding material by comparison with conventional methods such as, for example, heating by means of a circulating laser beam. As a result, it is advantageously possible to produce the device by mass production.

In one preferred development, the reactive material is arranged as a separate layer at at least one surface of the bonding material. Preferably, the reactive material is embodied as a film. In this case, the film is preferably arranged between the bonding material and one of the two substrates. The film is preferably arranged between the bonding material and one of the two substrates in such a way that the film bears against one of the surfaces of the bonding material, wherein the bearing area is preferably embodied to be as large as possible.

In one preferred development, the reactive material is arranged as a separate layer between two partial regions of the bonding material. Preferably, the reactive material is embodied as a film. In this case, the film preferably separates the two partial regions of the bonding material. The film is preferably arranged between the two partial regions of the bonding material in such a way that the film respectively bears against the bonding material at two surfaces, wherein the bearing areas are preferably embodied to be as large as possible.

After an initial ignition, the reactive material subsequently reacts by means of an exothermic chemical process. In this case, the reactive material, preferably the film, becomes incandescent and causes the bonding material temporarily to soften in regions bearing against the film. In the case of an arrangement of the reactive material between two partial regions of the bonding material, substantially homogeneous softening of the bonding material is advantageously effected.

After the cooling of the bonding material and of the reactive material, a preferably hermetically impermeable connection between the two substrates is advantageously formed.

In one preferred embodiment, the first substrate and/or the second substrate are/is in each case a glass substrate. Particularly preferably, the first substrate and/or the second substrate contain(s) window glass.

Window glass should be understood to mean, in particular, a lime-containing sodium-containing glass that contains calcium carbonate, for example. Further carbonates and/or oxides and impurities can furthermore be contained in the window glass. Such a glass is also known as soda-lime glass.

In the case of the connection technique by means of an exothermic chemical process of the reactive material, by contrast, heating of the substrates or one of the substrates can advantageously be minimized, since the heating of the bonding material takes place directly in the bonding material itself or at least in regions at at least one surface of the bonding material.

In one preferred embodiment, the bonding material comprises a glass frit. The term glass frit is understood to mean an intermediate product during the production of glass melts. The glass frit arises as a result of superficial melting of glass powder, wherein the glass grains melt together. The glass frit consists of a porous material.

In a further embodiment, the bonding material comprises a glass solder. A glass solder for encapsulating a device is known for example from the document U.S. Pat. No. 6,936, 963 B2, the disclosure content of which is hereby incorporated by reference.

Preferably, the electrical feed of the organic optoelectronic component is effected on those surfaces of the first and/or of the second substrate which face the optoelectronic component. The bonding material is thus in direct contact with the electrical feed. Preferably, the bonding material is electrically insulating at least in regions in which the electrical feed of the organic optoelectronic component is situated. Particularly preferably, the bonding material is electrically insulating over the entire region.

The optoelectronic component is preferably a radiation emitting component, particularly preferably an organic light emitting diode (OLED). The optoelectronic component can furthermore be an organic photodiode or an organic solar cell.

A method for producing a device comprising a first substrate, a second substrate, an optoelectronic component and a bonding material comprises the following method steps:
  providing a first substrate on which is arranged at least one optoelectronic component containing at least one organic material,
  providing a second substrate,
  arranging a bonding material on the first or second substrate in a frame-type fashion, wherein a reactive material is introduced in the bonding material or said reactive material is arranged as a separate layer at at least one surface of the bonding material,
  arranging the first substrate and the second substrate relative to one another in such a way that the optoelectronic component and the bonding material are arranged between the first substrate and the second substrate, wherein the bonding material encloses the optoelectronic component in a frame-type fashion, and
  providing an initial ignition which triggers an exothermic chemical process of the reactive material.

In this case, the bonding material can be arranged on the second substrate. In this case, the first substrate and the second substrate are subsequently arranged relative to one another in such a way that the bonding material encloses the optoelectronic component in a frame-type fashion.

Alternatively, the bonding material can be arranged on the first substrate, wherein in this case the bonding material is applied in such a way that the optoelectronic component is enclosed by the bonding material in a frame-type fashion. In this case, the optoelectronic component is preferably applied to the first substrate after the bonding material. Subsequently, in this case, the second substrate is arranged relative to the first substrate in such a way that the optoelectronic component and the bonding material are arranged between the first and second substrates.

In one preferred development, the reactive material is arranged as a separate layer between two partial regions of the bonding material. In this case, the film preferably separates the two partial regions of the bonding material. In this case, therefore, the reactive material preferably respectively adjoins a surface of a partial region of the bonding material.

Advantageous configurations of the method arise analogously to the advantageous configurations of the device, and vice versa. In particular, a device described here can be produced by means of the method. That means that the features disclosed in conjunction with the device are also disclosed for the method.

By means of a method of this type, it is possible to produce a device that comprises an organic optoelectronic component, wherein the organic optoelectronic, component is protected against ambient influences, such as moisture or air, for example, by the closure of the device. In this case, the device is produced in such a way that the organic optoelectronic component, during production, does not experience any thermal loading which could damage or even destroy the organic optoelectronic component.

The bonding material preferably has a pasty consistency for application to one of the substrates, such that the bonding material starting at a point, preferably without an interruption, can be applied in such a way that it forms a closed frame. After the bonding material has been applied, it is sintered preferably together with the substrate to which it has been applied.

Alternatively, the bonding material has a powder-like consistency and is sprinkled onto one of the substrates.

Preferably, the bonding material is temporarily heated by means of the chemical process, such that the bonding material is softened and the first substrate and the second substrate are mechanically connected to one another.

Preferably, after the initial ignition, the exothermic process of the reactive material propagates automatically. The initial ignition is preferably effected by means of a spark or a laser beam.

The fact that the exothermic process propagates automatically after the initial ignition makes it possible to simultaneously encapsulate a multiplicity of optoelectronic components arranged jointly on one of the substrates. In this case, the optoelectronic components can be jointly enclosed by the bonding material, or each optoelectronic component is individually enclosed by the bonding material in a frame-type fashion and thus forms a separate device.

For this purpose, the individual bonding materials of the devices that are to be produced jointly are skillfully concatenated, such that a multiplicity of optoelectronic devices are encapsulated simultaneously after initial ignition, wherein the devices are subsequently preferably singulated. Mass production of the optoelectronic devices is advantageously made possible as a result.

Skillful concatenation should be understood to mean, inter alia, that the individual bonding materials of the devices that are to be produced jointly are strung together without interruption, such that, after initial ignition, the exothermic process can propagate automatically over the individual bonding materials without interruption. By way of example, the individual bonding materials are in each case arranged in a frame-type fashion around one or more components, wherein the individual frame-type bonding materials are in each case connected to one another via connecting lines which at least likewise comprise the reactive material.

DETAILED DESCRIPTION OF DRAWINGS

Identical or identically acting constituent parts are in each case provided with the same reference symbols. The illustrated constituent parts and also the size relationships of the constituent parts among one another should not be regarded as true to scale.

Figure 1:
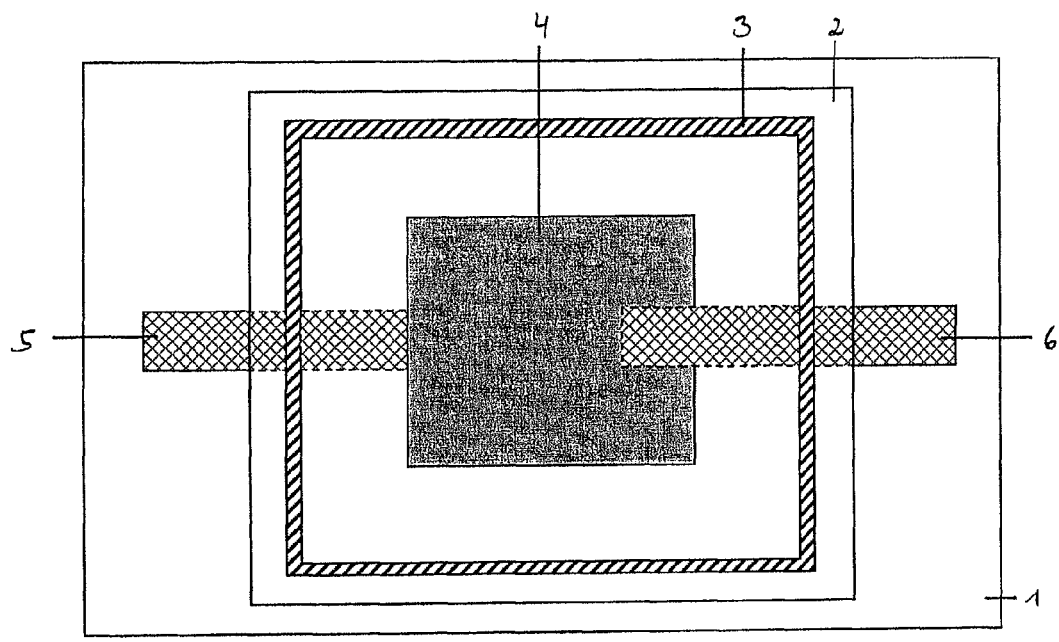
FIG. 1 shows a schematic plan view of a first exemplary embodiment of a device according to the invention.
Figure 2:
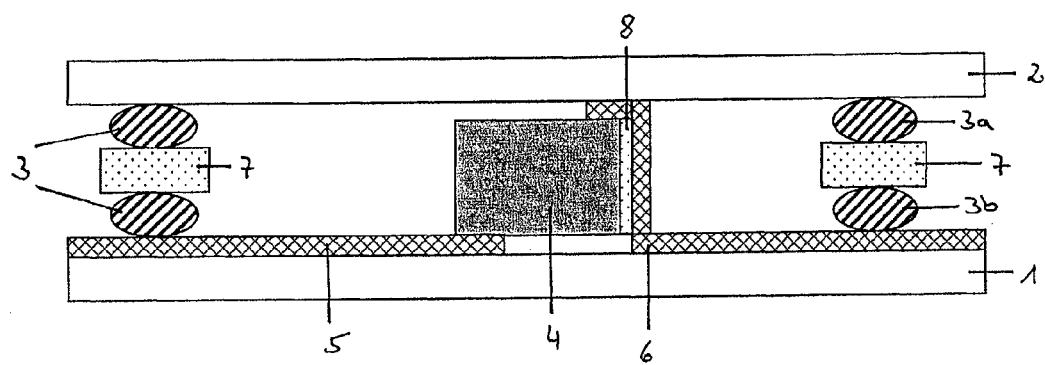
FIG. 2 shows a schematic cross section of the first exemplary embodiment from FIG. 1.
Figure 3A:
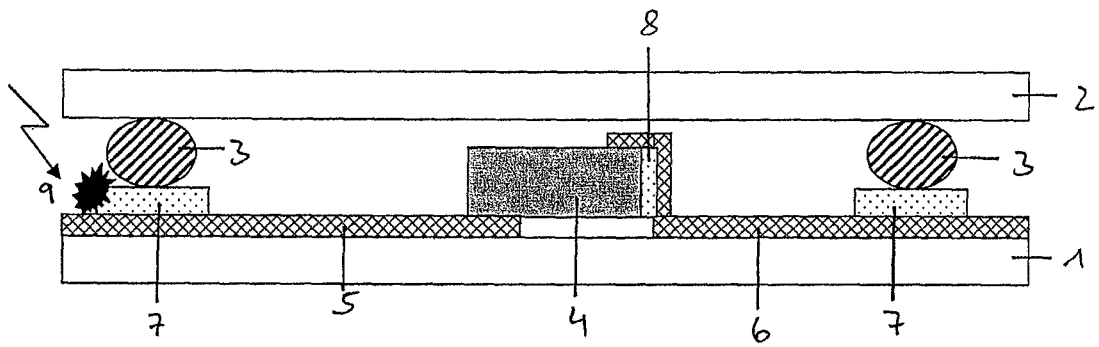
FIG. 3a shows a schematic cross section of a second exemplary embodiment of a device according to the invention during the method step of initial ignition.
Figure 3B:
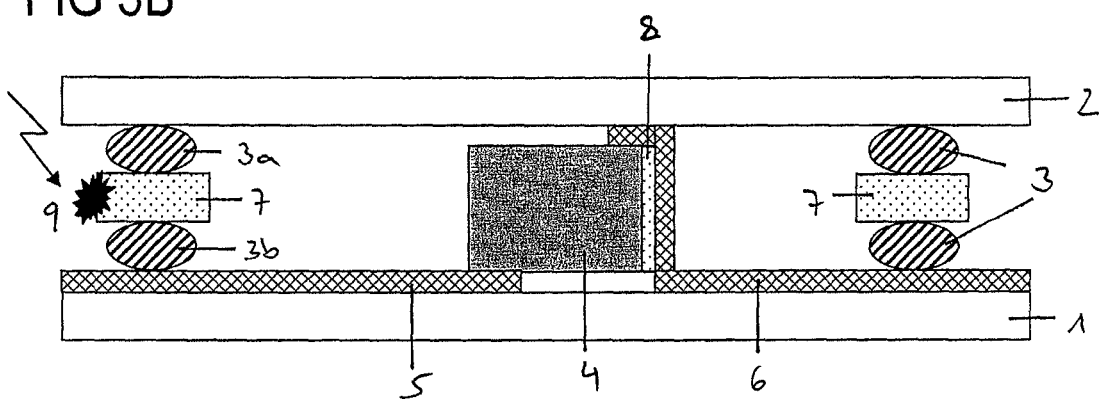
FIG. 3b shows a schematic cross section of a third exemplary embodiment of a device according to the invention during the method step of initial ignition.
Figure 3C:
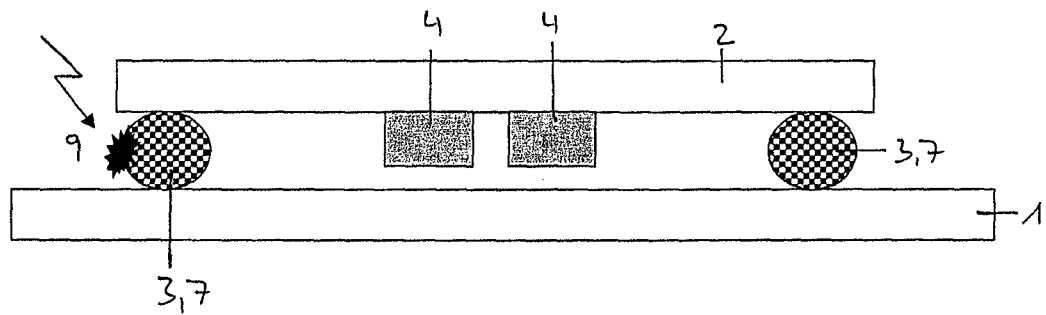
FIG. 3c shows a schematic cross section of a fourth exemplary embodiment of a device according to the invention during the method step of initial ignition.

FIGS. 1 to 3 in each case illustrate a device comprising a first substrate 1 and a second substrate 2. FIGS. 3a to 3c in each case illustrate a method step for producing such a device.

FIG. 1 shows a schematic plan view of a device. In this respect, FIG. 2 illustrates a schematic cross section of the device from FIG. 1. The device comprises a first substrate 1 and a second substrate 2. An optoelectronic component 4 is arranged between the first substrate 1 and the second substrate 2. The optoelectronic component 4 contains at least one organic material.

Figure 4:
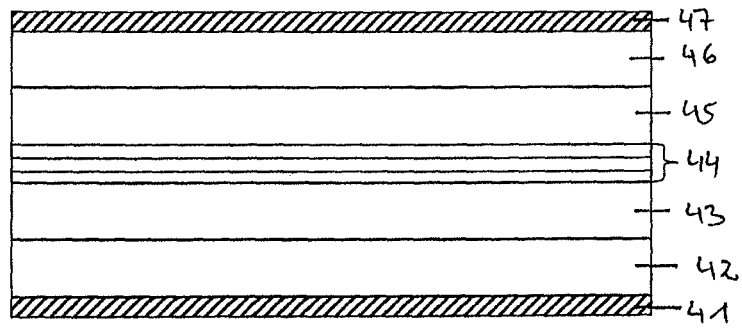
FIG. 4 shows a schematic cross section of an organic light emitting diode (OLED).

The optoelectronic component 4 is preferably a radiation emitting component, particularly preferably an organic light emitting diode (OLED). An OLED is distinguished by the fact that at least one layer of the OLED comprises an organic material. An OLED has the following construction, for example, which is illustrated, inter alia, in FIG. 4:

cathode 47,
electron inducing layer 46,
electron conducting layer 45,
emissive layers 44,
hole conducting layer 43,
hole inducing layer 42, and
anode 41.

One of the layers, preferably all the layers with the exception of the cathode and the anode, comprises an organic material.

The optoelectronic component 4 can furthermore be a photodiode or a solar cell which contains at least one organic material.

A bonding material 3 is arranged between the first substrate 1 and the second substrate 2. Preferably, the bonding material 3 encloses the optoelectronic component 4 in a frame-type fashion. Furthermore, the bonding material 3 mechanically connects the first substrate 1 and the second substrate 2 to one another.

The bonding material preferably completely encloses the optoelectronic component 4. As a result, the bonding material 3 protects the optoelectronic component 4 against ambient influences. Ambient influences should be understood to mean, in particular, the penetration of air or moisture into the device. Precisely in the case of optoelectronic components 4 having at least one organic layer, the contact with air or moisture disadvantageously leads to damage or even to destruction of the optoelectronic organic component 4. That is advantageously avoided by means of the bonding material 3.

Consequently, the airtight sealing of the device by means of the bonding material 3 advantageously increases the lifetime of the organic optoelectronic component significantly.

Preferably, the first substrate 1 projects beyond the second substrate 2 laterally in a plan view of the second substrate 2, as illustrated in FIG. 1. That means that the first substrate 1 and the second substrate 2 have different sizes of the base areas, wherein the first substrate 1 preferably has a larger base area than the second substrate 2.

The electrical feed 5, 6 of the organic optoelectronic component 4 is preferably effected on that surface of the first substrate 1 which faces the optoelectronic component 4. In this case, one of the electrical feeds 5, 6 is routed from a contact of the optoelectronic component 4 that is situated on that side of the optoelectronic component 4 which faces away from the first substrate via a side area of the optoelectronic component 4 to the first substrate 1. In this case, the routing along the side area of the optoelectronic component 4 is electrically insulated from the layers of the optoelectronic component 4 by an electrically insulating layer 8.

By virtue of the fact that the first substrate 1 preferably has a larger base area than the second substrate 2, the electrical feed 5, 6 of the optoelectronic component 4 can be led out from the bonding material 3 and be electrically connected there. As illustrated in FIG. 1, therefore, the electrical feed 5, 6 of the optoelectronic component 4 projects laterally beyond the second substrate 2, such that the electrical feed 5, 6 can be electrically connected in a manner that can be achieved without any problems.

As illustrated in FIG. 2, the bonding material 3 has two partial regions 3a, 3b. A reactive material 7, which is preferably embodied as a film, is arranged between the two partial regions 3a, 3b. In this case, the reactive material 7 is arranged between the partial regions 3a, 3b of the bonding material 3 in such a way that the bonding material 3a, 3b bears against the upper surface and the lower surface of the reactive material 7. The airtight sealing of the device is effected by means of an exothermic chemical process of the reactive material 7. For this purpose, by means of the chemical reaction, the bonding material 3 is temporarily melted and subsequently hardened by means of cooling, such that a mechanical connection arises between the first substrate 1 and the second substrate 2.

The exothermic chemical reaction preferably starts by means of an initial ignition that triggers the exothermic chemical process of the reactive material 7. As a result of the exothermic chemical process, which preferably propagates automatically, the reactive material heats up. As a result of heat transfer, in this case the bonding material 3a, 3b softens at least in the surrounding of the reactive material 7.

In this case, regions of the device which are not arranged in the surrounding of the reactive material 7 experience no or hardly any heating. As a result, the risk of damage to the organic optoelectronic component during the process for producing the device can advantageously be minimized. After the exothermic chemical process has ended, the heating-up and heating of the bonding material 3 also end.

The first substrate 1 and/or the second substrate 2 are/is preferably in each case a glass substrate.

Particularly preferably, the first substrate 1 and/or the second substrate 2 contain(s) window glass.

Window glass constitutes a cost-effective material in comparison with other glass materials, such as borosilicate glass, for example. Consequently, a device comprising a first substrate 1 and a second substrate 2 composed of window glass can advantageously be produced in a cost-effective manner.

Preferably, the bonding material 3 comprises a glass frit. Alternatively, the bonding material 3 can comprise a glass solder.

The reactive material 7 preferably comprises a material or a material mixture that has the property of—by means of an initial ignition—preferably reacting without evolution of gas and of releasing energy in the process. As a result, the reactive material 7 heats up, whereby the bonding material 3a, 3b situated in the surrounding of the reactive material 7 advantageously softens.

In regions of the electrical feed 5, 6, the bonding material 3a, 3b is in direct contact with the electrical feed 5, 6. In order to avoid a short circuit that could be imparted by the bonding material 3a, 3b, the bonding material 3a, 3b is preferably electrically insulating at least in regions in which the electrical feed 5, 6 of the organic optoelectronic component 4 is situated. The bonding material 3a, 3b can be electrically insulating in the entire region.

Preferably, the bonding material 3a, 3b is not in direct contact with the organic optoelectronic component 4.

FIGS. 3a, 3b and 3c in each case illustrate an example of the method step of initial ignition. An initial ignition 9 is in each case effected by means of, for example, a spark or a laser flash, which starts the exothermic chemical reaction of the reactive material 7. By means of the chemical reaction, the reactive material 7 heats up and thus temporarily heats the bonding material 3 by means of heat transfer, such that the bonding material 3 is softened and the first substrate 1 and the second substrate 2 are mechanically connected to one another.

In this case, the production method makes it possible to produce a device in which the organic optoelectronic component 4, during the production method, experiences no thermal loading that damages or even destroys the organic optoelectronic component 4.

Furthermore, it is not necessary for a laser beam to be guided along the bonding material, as is conventionally the case. The outlay on apparatus for the production method is thus advantageously comparatively reduced.

FIG. 3a illustrates a device in which the reactive material 7 is arranged as a film between the bonding material 3 and the first substrate 1. In this case, the reactive material 7 is in direct contact with a surface of the bonding material 3, with a surface of the first substrate 1 and with the electrical feeds 5, 6 arranged thereon.

By way of example, a method for production can comprise the method steps mentioned below:

A glass frit 3 is applied, for example sprinkled, preferably sintered, onto a second substrate 2 in a frame-type fashion. A film comprising a reactive material 7 is placed onto the glass frit 3, which is present as a powder, for example. Furthermore, a first substrate 1 is provided, on which an organic optoelectronic component 4 is applied.

The first substrate 1 is then placed onto the second substrate 2. The first substrate 1 is placed onto the second substrate 2 in such a way that the organic optoelectronic component 4 is arranged between the first substrate 1 and the second substrate 2. Furthermore, the first substrate 1 and the second substrate 2 are arranged relative to one another in such a way that the glass frit 3 encloses the organic optoelectronic component 4 in a frame-type fashion.

Preferably, a weight is placed on the first substrate 1, said weight pressing the first and second substrates 1, 2 against one another. Preferably, at least one spacer, for example an enamel ring, is arranged (not illustrated) between the first substrate 1 and the second substrate 2.

Spacers serve to define a fixed distance between first substrate 1 and second substrate 2 in a targeted manner. It is thereby possible to avoid a situation in which, during the process of softening the bonding material 3, the substrates 1, 2 does not undershoot the distance defined by the spacers, such that the organic optoelectronic components 4, during the production method, are not damaged by an excessively small distance between the first substrate 1 and the second substrate 2.

The initial ignition 9 is subsequently effected, for example by means of a spark or a short laser flash. As a result of the initial ignition 9, an exothermic chemical reaction of the reactive material 7 arranged between the bonding material 3 and the first substrate 1 starts. After the initial ignition 9, the exothermic process of the reactive material 7 preferably propagates automatically along the film. As a result, the film with reactive material 7 contained therein is heated and softens the bonding material 3 temporarily.

The first and second substrates 1, 2 preferably have a high heat capacity, such that, as a result of the high heat capacity, the molten bonding material 3 promptly solidifies and forms a hermetically impermeable connection between the first substrate 1 and the second substrate 2.

As a result of the hermetic encapsulation by means of an exothermic chemical process, a multiplicity of organic optoelectronic components 4 can advantageously be encapsulated simultaneously (not illustrated). For this purpose, the bonding material and the reactive material are skillfully concatenated on one of the substrates, such that, after initial ignition, a multiplicity of cells comprising an organic optoelectronic component contained therein can be encapsulated at the same time.

FIG. 3b illustrates a device in which the reactive material 7 is arranged as a film between two partial regions 3a, 3b of the bonding material 3. In this case, the reactive material 7 is in direct contact with at least one respective surface of a partial region 3a, 3b of the bonding material 3.

A method for producing a device illustrated in FIG. 3b can comprise, for example, in contrast to the method steps for producing the device from FIG. 3a, the method steps mentioned below:

A first layer of a glass frit 3 is applied, for example sprinkled, preferably sintered, onto a second substrate 2 in a frame-type fashion. A film comprising a reactive material 7 is placed onto the first layer of the glass frit 3, which is present as a powder, for example. Furthermore, a first substrate 1 is provided, on which an organic optoelectronic component 4 is applied. A second layer of glass frit 3 is applied, for example sprinkled, preferably sintered, onto the first substrate 1, wherein the second layer of glass frit 3 surrounds the organic optoelectronic component 4 in a frame-type fashion.

Alternatively, firstly a second layer of glass frit 3 can be sintered onto the first substrate 1, and then an organic optoelectronic component 4 can be applied. In such a method, the organic optoelectronic component 4 is protected against damage that can arise on account of high temperatures during the sintering process.

The first and second substrates are subsequently joined together for example by means of the method steps as described with regard to FIG. 3a.

The method step of encapsulation, as illustrated in FIG. 3c, differs from the method step illustrated in FIGS. 3a and 3b in that the reactive material 7 is introduced directly into the bonding material 3. Preferably, the reactive material 7 is distributed homogeneously in the bonding material 3. Uniform heating of the bonding material 3 can be effected as a result. In this case, after initial ignition 9, the reactive material 7 reacts exothermically and advantageously propagates automatically, such that a preferably hermetically impermeable encapsulation arises.

Furthermore, in contrast to the device from FIGS. 3a and 3b, between the first substrate 1 and the second substrate 2, a plurality of organic optoelectronic components 4 are arranged between first substrate 1 and second substrate 2. Accordingly, the device is not restricted to the use of only one optoelectronic component 4. The number of organic optoelectronic components 4 can vary in relation to the intended use of the device.

The invention is not restricted to the exemplary embodiments by the description on the basis of said exemplary embodiments, but rather encompasses any novel feature and also any combination of features, which in particular includes any combination of features in the patent claims, even if this feature or this combination itself is not explicitly specified in the patent claims or exemplary embodiments.

The invention claimed is:

1. A device comprising: a first substrate; a second substrate; at least one optoelectronic component containing at least one organic material arranged on the first substrate; the first substrate and the second substrate being arranged relative to one another in such a way that the optoelectronic component is arranged between the first substrate and the second substrate; a bonding material arranged between the first substrate and the second substrate, said bonding material enclosing the optoelectronic component in a frame type fashion and mechanically connecting the first and second substrates to one another; and wherein the bonding material was softened by an exothermic chemical process of a reactive material for mechanically connecting the substrates, and prior to the exothermic chemical process, the reactive material is introduced into the bonding material and is distributed homogeneously in the bonding material.

2. The device according to claim 1, wherein the first substrate and/or the second substrate are/is a glass substrate.

3. The device according to claim 1, wherein the bonding material comprises a glass frit.

4. The device according to claim 1, wherein the bonding material comprises a glass solder.

5. The device according to claim 1, wherein the optoelectronic component is an organic light emitting diode.

6. A method for producing a device comprising the steps of: providing a first substrate on which is arranged at least one optoelectronic component containing at least one organic material; providing a second substrate; arranging a bonding material on the first or second substrate in a frame type fashion, wherein the bonding material was softened by an exothermic chemical process of a reactive material for mechanically connecting the substrates, and prior to the exothermic chemical process, the reactive material is introduced in the bonding material and is distributed homogeneously in the bonding material; arranging the first substrate and the second substrate relative to one another in such a way that the optoelectronic component and the bonding material are arranged between the first substrate and the second substrate, wherein the bonding material encloses the optoelectronic component in a frame type fashion; and providing an initial ignition which triggers an exothermic chemical process of the reactive material.

7. The method according to claim 6, wherein a device according to claim 1 is produced.

8. The method according to claim 6, wherein after the initial ignition the exothermic process of the reactive material propagates automatically.

9. The method according to claim 6, wherein the initial ignition is effected by means of a spark or a laser flash.

10. The method according to claim 6, wherein the bonding material is temporarily heated by means of the chemical process, such that the bonding material is softened, and the first substrate and the second substrate are mechanically connected to one another.

11. A device comprising: a first substrate; a second substrate; at least one optoelectronic component containing at least one organic material arranged on the first substrate; the first substrate and the second substrate being arranged relative to one another in such a way that the optoelectronic component is arranged between the first substrate and the second substrate, wherein the first substrate has a larger base area than the second substrate, and the first substrate projects beyond the second substrate laterally in a plan view of the second substrate; a bonding material arranged between the first substrate and the second substrate, said bonding material enclosing the optoelectronic component in a frame type fashion and mechanically connecting the first and second substrates to one another; wherein the bonding material was softened by means of an exothermic chemical process of a reactive material for mechanically connecting the substrates, and prior to the exothermic chemical process, the reactive material is introduced into the bonding material and is distributed homogeneously in the bonding material, wherein the first substrate and/or the second substrate are/is a glass substrate, wherein the bonding material comprises a glass frit or a glass solder, wherein the optoelectronic component is an organic light emitting diode (OLED), and wherein the device further comprises electrical feeds of the optoelectronic component, the electrical feeds being disposed on a surface of the first substrate facing the optoelectronic component, and the electrical feeds extending out from the bonding material and projecting laterally beyond the second substrate.

12. The device according to claim 1, wherein the bonding material comprises residues of the reactive material.

* * * * *